United States Patent
Kaneko

(10) Patent No.: US 7,064,907 B2
(45) Date of Patent: Jun. 20, 2006

(54) OPTICAL PART AND ITS MANUFACTURING METHOD

(75) Inventor: Tsuyoshi Kaneko, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/854,285

(22) Filed: May 27, 2004

(65) Prior Publication Data

US 2005/0013013 A1   Jan. 20, 2005

(30) Foreign Application Priority Data

Jun. 12, 2003  (JP) .............................. 2003-168269

(51) Int. Cl.
*G02B 7/02*  (2006.01)
(52) U.S. Cl. ..................... 359/811; 359/819
(58) Field of Classification Search ............... 359/811, 359/819; 396/526; 362/455; 353/100; 65/37
See application file for complete search history.

(56) References Cited

U.S. PATENT DOCUMENTS

| | | | |
|---|---|---|---|
| 4,501,637 A | 2/1985 | Mitchell et al. | |
| 4,727,457 A | 2/1988 | Thillays | |
| 6,043,481 A * | 3/2000 | Tan et al. | 250/216 |
| 2002/0044582 A1 | 4/2002 | Kondo | |
| 2003/0025449 A1 | 2/2003 | Rossner | |

FOREIGN PATENT DOCUMENTS

| | | |
|---|---|---|
| EP | 1 059 667 A2 | 12/2000 |
| JP | A 2000-2802 | 1/2000 |
| JP | A 2003-258380 | 9/2003 |
| JP | A 2004-117660 | 4/2004 |
| JP | A 2004-118003 | 4/2004 |
| JP | A 2004-119581 | 4/2004 |
| JP | A 2004-119582 | 4/2004 |
| WO | WO 99/31737 | 6/1999 |

* cited by examiner

*Primary Examiner*—Hung Xuan Dang
*Assistant Examiner*—Joseph Martinez
(74) *Attorney, Agent, or Firm*—Oliff & Berridge, PLC

(57) ABSTRACT

The invention provides an optical part, whose set-up position, shape, and size are properly controlled, and its manufacturing method. The optical part of this invention can include a substrate having an optical surface, a spire part being set up in a manner of surrounding the optical surface, and an optical member at least partly being placed on the optical surface. A tip of the spire part is located at a higher position than the optical surface.

13 Claims, 15 Drawing Sheets

Fig. 6
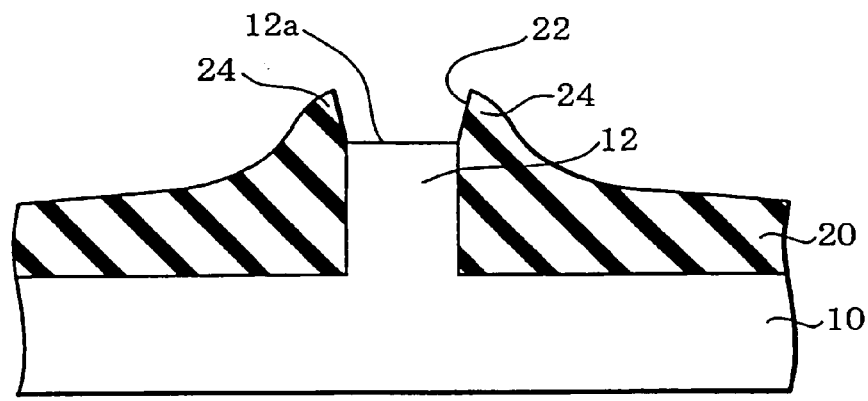
Fig. 7
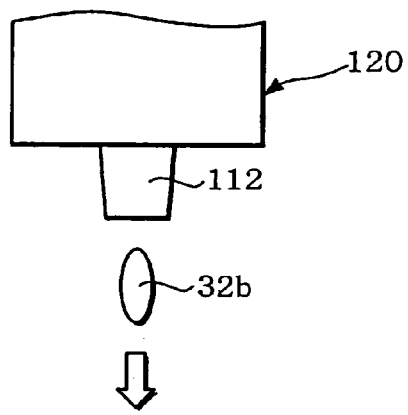
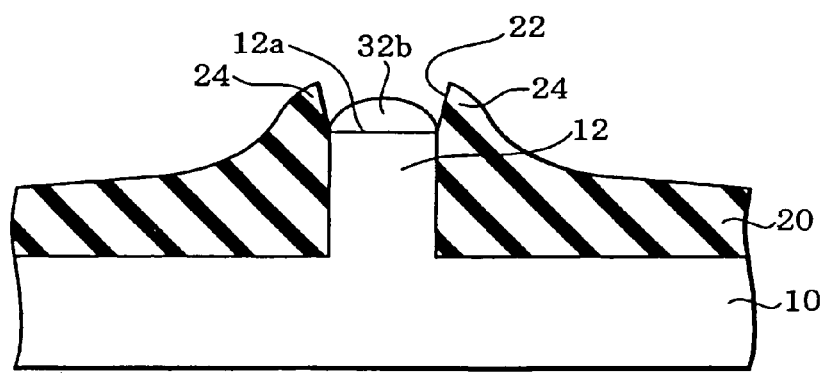

OPTICAL PART AND ITS MANUFACTURING METHOD

CROSS-REFERENCE TO RELATED APPLICATION

The present application claims priority to Japanese Patent Application No. 2003-168269 filed Jun. 12, 2003 which is hereby expressly incorporated by reference herein in its entirety.

BACKGROUND OF THE INVENTION

1. Field of Invention

This invention relates to an optical part, whose set-up position, shape and size are properly controlled, and its manufacturing method.

2. Description of Related Art

For example, as a method of manufacturing optical members, such as a lens, there is known a method in which after a liquid droplet is ejected to a substrate, it is hardened to manufacture an optical member. For example, in Japanese Published Patent No. 2000-2802, there is disclosed a method of manufacturing micro-lens by using an inkjet head to eject the liquid droplet. In this method, prior to ejecting the liquid droplet, liquid repellent processing or lyophilic processing is carried out on an area which the liquid droplet is to land. However, according to this method, there are cases where it can be difficult to strictly control the shape and place of formation of a lens.

SUMMARY OF THE INVENTION

It is an object of this invention to provide an optical part, whose set-up position, shape and size are properly controlled, and its manufacturing method.

An optical part of this invention can include a substrate having an optical surface, a spire part set up in a manner of surrounding the optical surface; an optical member being set up on at least part of the optical surface, whereby a tip of the spire part is located at a higher position than the optical surface. Here, the spire part refers to a pointed part. Further, the optical surface means an incident surface of light to the optical member or a surface from which light emits from the optical member.

Now, so long as the substrate has a surface on which the optical surface may be provided, there are no specific restrictions on the shape and function thereof. For example, the substrate may include an opto-electrical element or may not have a function as an element. Still further, the optical member refers to a member having a function to alter a property and a direction of propagation of light.

Furthermore, the spire part set up in a manner of surrounding the optical surface means that the optical surface is provided on at least part of the area surrounded by the spire part.

According to the optical member of this invention, a configuration mentioned above makes it possible to obtain an optical part including an optical member, whose set-up position, shape and size have been properly controlled, by regulating the shape and height of the spire part. Details will be described below.

The optical part of this invention may take any of the following modes from (A) to (H).

(A) The spire part may be set up on the substrate.

(B) A covering layer may be set up above the substrate with the spire part set up on the covering layer.

(C) A top part of the optical member may be located at a higher position than the tip of the spire part.

(D) A part functioning as an opto-electrical element may be provided below the optical surface.

(E) The optical member may function as a lens. In this case, a circle or an ellipse may be formed by the tip of the spire part, and a section of the optical member is a circle or an ellipse, whereas a center of the optical surface may be made to coincide with a center of a circle or an ellipse formed by the tip of the spire part.

(F) A circle or an ellipse may be formed by the spire part, and it is possible to make a maximum diameter of the section of the optical member larger than a maximum diameter of a circle or an ellipse formed by the tip of the spire part. Now, in a case of a circle formed by the tip of the spire part, the maximum diameter of the circle is a diameter of the circle, while in a case of an ellipse formed by the tip of the spire part, the maximum diameter of the ellipse is a major axis of the ellipse.

(G) It is possible to set up a concave part on the substrate such that the optical surface may be provided on at least part of an upper surface of the concave part. In this case, the concave part may constitute at least part of the opto-electrical element.

(H) A perimeter of the optical member may be embedded with a sealant.

A manufacturing method of the optical part of this invention can include: (a) a spire part that is formed above a substrate having an optical surface in a manner of surrounding the optical surface, while forming a tip of the spire part at a higher position than the optical surface, (b) ejecting a liquid droplet to the optical surface and forming a precursor of an optical member, and (c) forming the optical member by hardening the precursor of the optical member.

According to the manufacturing method of the optical part of this invention mentioned above, in (a) above, the shape and height of the spire part can be adjusted, and in (b) above, by adjusting a volume of ejection of the liquid droplet and the like, it is possible to form an optical part including an optical member whose set-up position, shape, and size are properly controlled. Details will be described below.

The manufacturing method of the optical part of this invention may take any of the following modes from (A) to (J).

(A) In (a) above, the spire part may be formed on the substrate.

(B) In (a) above, the covering layer may be formed above the substrate with the spire part set up on the covering layer.

(C) In (c) above, the top part of the optical member may be formed at a higher position than the tip of the spire part.

(D) A part functioning as an opto-electrical element may be provided below the optical surface.

(E) In (a) above, a circle or an ellipse may be formed into a circle or an ellipse, while a center of the optical surface may be made to coincide with a center of a circle or an ellipse formed by the tip of the spire part.

(F) In (a) above, a tip of the spire may be made into a circle or an ellipse, and in (c) above, it is possible to make a maximum diameter of a section of the optical member larger than a maximum diameter of a circle or an ellipse.

(G) It is possible to set up a convex part on the substrate such that the optical surface may be provided on at least part of an upper surface of the convex part. In this case, the convex part may constitute at least part of the opto-electrical element.

(H) Further, it is possible to include (d) embedding the surroundings of the optical member with a sealant.

(I) In (b) above, ejection of the liquid droplet may be carried out by an ink-jet method. In this context, the "Inkjet Method" means a method of ejecting a liquid droplet by using the inkjet head. Note, however, that in this case, the liquid droplet is not so-called ink used for printed matter, but liquid matter including a raw material of the optical member. According to this method, it is possible make fine adjustment of an ejection volume of the liquid droplet, so that a minute precursor of the optical member may be simply set up on the optical surface.

(J) In (c) above, hardening of the precursor of the optical member may be performed by adding energy.

BRIEF DESCRIPTION OF THE DRAWINGS

The invention will be described with reference to the accompanying drawings, wherein like numerals reference like elements, and wherein:

FIG. 6 is a sectional view schematically showing the manufacturing process of the optical part shown in FIG. 1 and FIG. 2;

FIG. 7 is a sectional view schematically showing the manufacturing process of the optical part shown in FIG. 1 and FIG. 2;

DETAILED DESCRIPTION OF PREFERRED EMBODIMENTS

Referring to drawings, preferred embodiments of this invention will be described.

Figure 1:
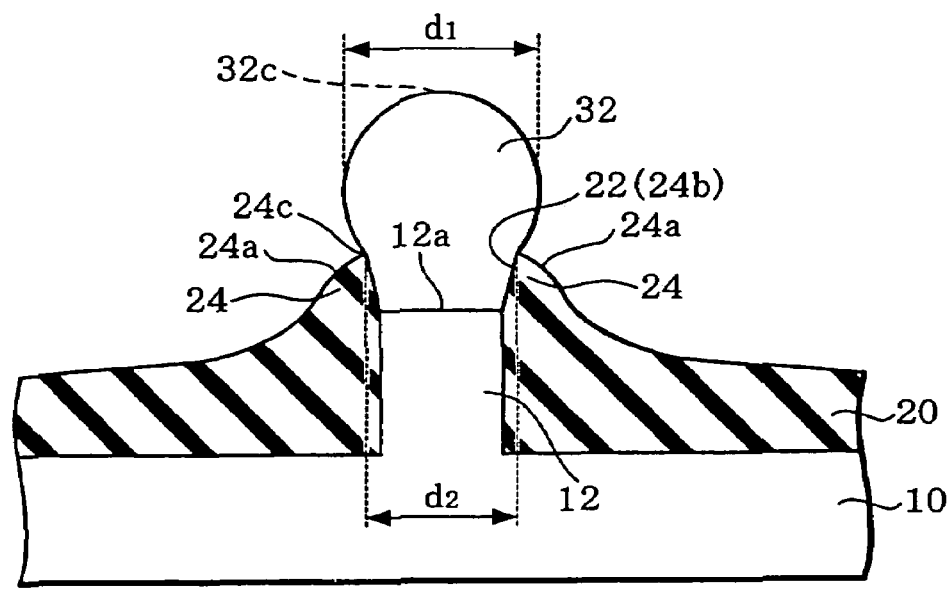
FIG. 1 is a sectional view schematically showing an optical part according to a first embodiment.
Figure 2:
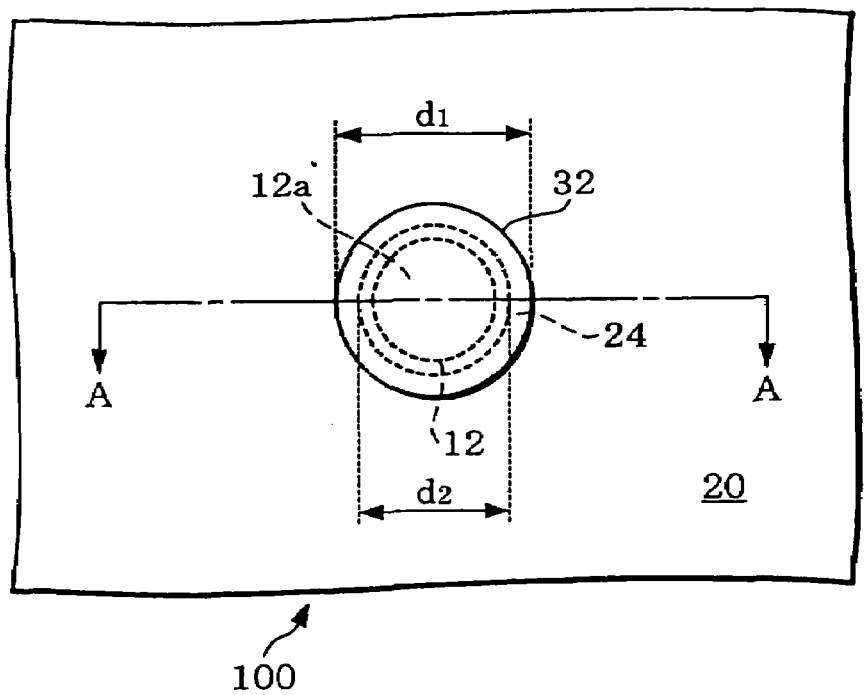
FIG. 2 is a plan view schematically showing the optical part shown in FIG. 1.

FIG. 1 is a schematic sectional view of an optical part 100 according to a first embodiment to which this invention is applied. FIG. 2 is a plan view schematically showing the optical part 100 shown in FIG. 1. It is to be noted that FIG. 1 is a diagram showing a section along line A—A in FIG. 2.

The optical part 100 of this embodiment can include a substrate 10 having an optical surface 12a, a spire part 24 set up in a manner of surrounding the optical surface 12a, and an optical member 32 set up on the optical surface 12a. Further, a tip 24c of the spire part 24 is provided at a higher position than the optical surface 12a.

Still further, in the optical part 100 of this embodiment, a covering layer 20 is provided over the substrate 10, and the spire part 24 is set up on the covering layer 24. In this manner, the spire part 24 is set up in a manner of surrounding the optical surface 12a such that an opening part 22 is formed on the optical surface 12a. Further, the optical surface 12a is positioned at a base of the opening part 22.

The optical member 32 permits light of a prescribed wavelength to pass. This optical member may have a function of, for example, subjecting incident light to focusing, polarization or spectral diffraction. It is to be noted that to pass in this context means light emitting from this optical member 32 after entry of light incident to the optical member 32, including not only a case where all the light entering the optical member 32 emits therefrom, but also a case where only part of the light entering the optical member 32 emits therefrom.

The optical part 100 may be the opto-electrical element such as a light-emitting device and a light-receiving device, or may be a part having no photo-electric conversion function (for example, a micro-lens substrate). This is the same as optical parts of other embodiments and working examples to be explained later.

Referring mainly to FIG. 1 and FIG. 2, each composing element of the optical part 100 of this embodiment will be described below.

Material of the substrate 10 may be determined according to the function of the optical part 100. As the substrate 100, there may be cited, for example, a semiconductor substrate such as a silicon substrate and a gallium arsenide substrate, a glass substrate, and a plastic substrate.

In the optical part 100 of this embodiment, as shown in FIG. 1 and FIG. 2, a column-shaped convex part 12 can be set up on a substrate 10. If the optical part 100 is an opto-electrical element, it is possible for this convex part 12 to constitute at least part of the opto-electrical element.

The convex part 12 may be that which is formed integrally with the substrate 10. In this case, the convex part 12 may be formed of the same material as the substrate 10. Further, such convex part 12 may be formed by, for example, subjecting the substrate 10 to patterning.

Or, the convex part 12 may be formed by setting up a different member on the substrate 10. For example, by mounting an opto-electrical element on the substrate 10, it is possible to form the convex part 12 (refer to working example 2 to be explained later). Or by using a process such as photolithography or stamping, it is possible to set up the convex part 12 on the substrate 10.

The optical member 32 (to be explained below) is formed by hardening a precursor of the optical member (to be explained later) after a liquid droplet is ejected to the optical surface 12a to form the precursor (to be explained below) of the optical member.

Now, in this embodiment, a base of the opening part 22 is the upper surface of the convex part 12, and further, there is shown a case of the optical surface 12a being the upper surface of the convex part 12. Though not illustrated, the optical surface may be at least part of the upper surface of the convex part. Further, though not illustrated, the optical surface may be at least part of the base of the opening part.

The shape of the base of the opening part 22 (the optical surface 12a) is determined by the shape and function of the opto-electrical element, depending on the function and usage of the optical member 32 formed on the base 12a and if it functions at least as part of the opto-electrical element. Namely, the shape of the base 12a of the opening part 22 is one element in determining the shape of the optical member 32.

In the optical part 100 of this embodiment, there is shown a case where the shape of the base 12a of the opening part 22 is a circle. However, the shape of the base 12a of the opening part 22 is not limited to this, and, for example, it may be an ellipse.

The optical member 32 may function as a lens. In this case, a circle or an ellipse is made up of the tip 24c of the spire part 24, and it is desirable that a section of the optical member 32 is a circle or an ellipse, the center of the optical surface 12a coinciding with the center of a circle or an ellipse made up of the tip 24c of the spire part 24. This is the same as the spire parts and the optical members of working examples and embodiments to be covered later. For example, in this embodiment, as shown in FIG. 2, a circle is made up of the tip 24c of the spire part 24, the section of the optical member 32 is a circle, and the center of the optical surface 12a coincides with the center of a circle made up of the tip 24c of the spire part 24.

Further, in this case, it is possible to make the shape of the base 12a of the opening part 22 a circle and, as shown in FIG. 1, make its top part 32c large enough to locate itself at a higher position than the spire part 24. Accordingly, it can be possible to form a cubic shape of a part above the spire part 24 of the optical member 32 in the shape of a sphere or a sectioned sphere, so that the optical member thus obtained may be used as a lens or a polarization element.

Further, though not illustrated, for example, when using the optical member as an anisotropic lens, it is possible to make the shape of the base 12a of the opening part 22 as an ellipsis and the optical member to be large enough to place its top part at a higher position than the spire part. This enables the optical member to be formed into the shape of an elliptical sphere or a sectioned elliptical sphere, thereby enabling the optical member thus obtained to be used as an anisotropic lens.

The optical surface 12a is provided on the convex part 12. Also, the optical surface 12a is provided on at least part of the base of the opening part 22. As mentioned above, in the optical part 100 of this embodiment, as shown in FIG. 1 and FIG. 2, there is shown a case where the base of the opening part 22 is the optical surface 12a.

Furthermore, in a case where the convex part 12 is set up on the substrate 10, the optical surface 12a may be provided on the upper surface of the convex part 12. As mentioned above, in the optical part 100 of this embodiment, as shown in FIG. 1 and FIG. 2, there is shown a case where the base of the opening part 22 is the upper surface of the convex part 12, the optical surface 12a being the upper surface of the convex part 12. Moreover, in a case where the optical part 100 is an opto-electrical element, a portion functioning as the opto-electrical element may be provided below the optical surface 12a.

The optical member 32 can be set up on the optical surface 12a. Also, as FIG. 1 shows, part of the optical member 32 is provided inside the opening part 22. It is sufficient for at least part of the optical member 32 to be provided on the optical surface 12a. Also, it is sufficient for at least part of the optical member 32 to be provided inside the opening part 22.

In the same way as the optical part 100 of this embodiment, if the convex part 12 is set up on the substrate 10 and the convex part 12 is a section, as shown in FIG. 1 and FIG. 2, a section of the optical member 32 is a circle, whereas it is possible to make the maximum diameter (diameter) $d_1$ of the section of the optical member 32 larger than the maximum diameter (diameter) $d_2$ of a circle made up of the tip 24c of the spire part 24. Also, the top part 32c of the optical member 32 is located at a higher position than the tip 24c of the spire part 24.

The optical member 32 is in a cubic shape corresponding to its usage and function. Since the cubic shape of the optical member 32 has been explained altogether in a section on the [substrate], detailed description will be omitted.

The optical member 32 is formed by hardening a hard-enable liquid material, for example, through addition of energy, such as heat or light. Specifically, in this embodiment, the optical member 32 is formed as a precursor of the optical member is hardened, after the liquid droplet consisting of the liquid material is ejected to the optical surface 12a, thus forming the precursor of the optical member (to be explained below).

The liquid material may include, for example, a precursor of a ultraviolet hardening type resin or a thermo-hardening type resin. For the ultraviolet hardening type resin, for example, there are an acrylic resin and an epoxy resin of the ultraviolet hardening type. Also, for the thermo-hardening type resin, a polyimide type resin of the thermo-hardening type may be illustrated.

The covering layer 20 is set up above the substrate 10. In the optical part 100 of this embodiment, the spire part 24 is set up on the covering layer 20, and the spire part 24 is provided in a manner of surrounding the optical surface 12a. Also, because the spire part 24 is provided in the manner of surrounding the optical surface 12a, the opening part 22 is formed on the optical surface 12a. In other words, part of a surface of the spire part 24 constitutes a side wall of the opening part 22.

As FIG. 1 shows, the spire part 24 has a first surface 24a and a second surface 24b. The first surface 24a of the spire part 24 (of the surface of the spire part 24, a portion not constituting the side wall of the opening part 22) has an incline. Specifically, the first surface 24a of this spire part 24, as it moves farther away from the opening part 22, has a shorter distance from the substrate 10. Namely, in an area in which the spire part 24 is formed, a film thickness of the covering layer 20 (a film thickness including the spire part 24) becomes smaller as it moves father away from the opening part 22. Also, the second surface 24b of the spire part 24 constitutes the side wall of the opening part 22. An intersection of the first surface 24a and the second surface 24b is the tip 24c.

Further, in the same way as the optical part 100 of this embodiment, if the convex part 12 is provided on the substrate 12, it is possible to set up the opening part 22 on the upper surface (optical surface) 12a of the convex part 12.

Although a material of the covering layer is not specified, for example, a material of high insulation such as a resin, a silicon oxide layer, a silicon nitride layer and a silicon oxide and nitride layer may be acceptable. For example, if the covering layer 20 consists of a resin, a polyimide type resin, an acrylic type resin, an epoxy type resin or a fluorine type resin may be used as the resin.

Figure 9:
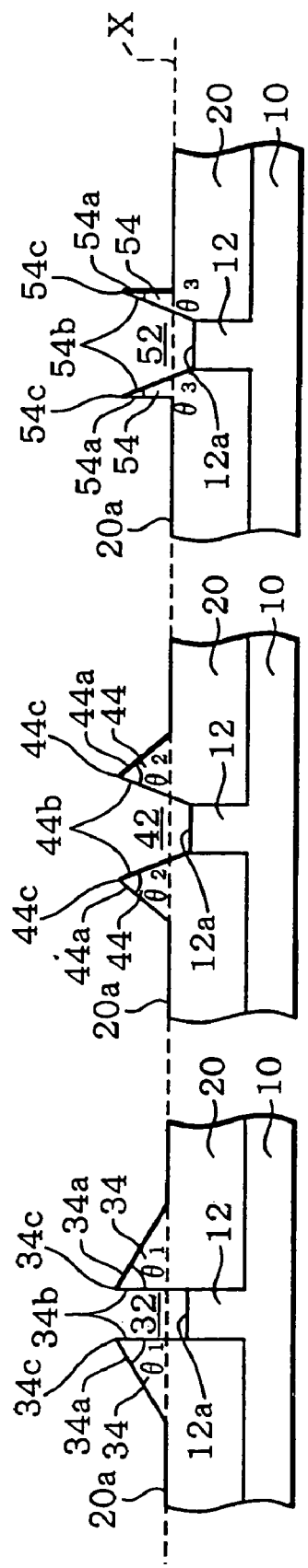
FIG. 9(a)–FIG. 9(c) are respective sectional views schematically showing variation examples of the optical part according to a first embodiment.

Variation examples of the spire part are shown from FIG. 9(a) to FIG. 9(c). FIG. 9(a) to FIG. 9(c) are respectively schematic sectional views of variation examples in which the shape of the spire part 24 of the optical part 11 shown in FIG. 1 is altered. Now, in FIG. 9(a) to FIG. 9(c), illustrations of the optical member are omitted. Also, in FIG. 9(a) to FIG. 9(c), the film thickness of the covering layer 20 is substantially constant in an area away from the spire part, and the upper surface of the covering layer 20 in the area where the film thickness of the covering layer 20 is constant is set as a reference surface X.

In a variation example shown in FIG. 9(a), the spire part 34 is set up on the covering layer 20 in a manner of surrounding the optical surface 12a. The tip 34c of the spire part 34 is positioned above the reference surface X. This spire part 34 has a first surface 34a and a second surface 34b. Of these, the first surface 34a constitutes part of the upper surface 20a of the covering layer 20, while the second surface 34b constitutes part of the sidewall of the opening part 32. Now, an intersection of the first surface 34a and the second surface 34b is the tip 34c of the spire part 34. This is the same as other variation examples to be covered later.

Also, an angle $\theta_1$ which is formed between the first surface 34a and the second surface 34b is an acute angle. This enables the optical member to be stably set up on the opening part 32. Still further, when the optical member is formed by means of ejecting the liquid droplet to the optical surface 12a, thereby forming the precursor of the optical member, and subjecting the precursor thereof to hardening, it is difficult for the first surface 34a thereof to be wet with the liquid droplet. As a result, in the same way as the optical part 100 shown in FIG. 1 and FIG. 2, it is possible to form an optical member having its top part at a higher position than the tip 34 thereof. In this case, it is possible to make the maximum diameter of a section of the optical member larger than the maximum diameter of a circle made up of the tip 34c thereof. This is the same as variation examples shown in FIG. 9(b) and FIG. 9(c).

In the variation example shown in FIG. 9(b), a spire part 44 is set up on the covering layer 20 in a manner of surrounding the optical surface 12a. A tip 44c of the spire part 44 is positioned above the reference surface X. This spire part 44 has a first surface 44a and a second surface 44b. Of these, the first surface 44a constitutes part of the upper surface 20a of the covering layer 20, while the second surface 44b constitutes part of the sidewall of an opening part 42. An angle $\theta_2$ which is formed between the first surface 44a and the second surface 44b is an acute angle. This enables the optical member to be stably set up on the opening part 42. Further, in the same way as the optical part 100 shown in FIG. 1 and FIG. 2, it is possible to form an optical member having its top part at a higher position than the tip 44c thereof. In this case, it is possible to make the maximum diameter of a section of the optical member larger than the maximum diameter of a circle made up of the tip 44c thereof. Furthermore, the diameter of the opening part 42 becomes larger as it moves farther away from a base of the opening part 42 (the upper surface 12a of the convex part 12).

In the variation example shown in FIG. 9(c), a spire part 54 is set up on the covering layer 20 in a manner of surrounding the optical surface 12a. A tip 54c of the spire part 54 is positioned above the reference surface X. This spire part 54 has a first surface 54a and a second surface 54b. Of these, the first surface 54a constitutes part of the upper surface 20a of the covering layer 20, while the second surface 54b constitutes part of the sidewall of an opening part 52. An angle $\theta_3$ which is formed between the first surface 54a and the second surface 54b is an acute angle, and an angle which is formed between the first surface 54a and the optical surface 12a is substantially a right angle. This enables the optical member to be stably set up on the opening part 52. Further, in the same way as the optical part 100 shown in FIG. 1 and FIG. 2, it is possible to form an optical member having its top part at a higher position than the tip 54c thereof. In this case, it is possible to make the maximum diameter of a section of the optical member larger than the maximum diameter of a circle made up of the tip 54c thereof. Furthermore, the diameter of the opening part 52 becomes larger as it moves farther away from a base of the opening part 52 (the upper surface 12a of the convex part 12)

Next, a manufacturing method of the optical part 100 shown in FIG. 1 and FIG. 2 will be described with reference to FIG. 3 to FIG. 8. FIG. 3 to FIG. 8 are respectively schematic sectional views of the manufacturing method of the optical part 100 shown in FIG. 1 and FIG. 2.

Figure 3:
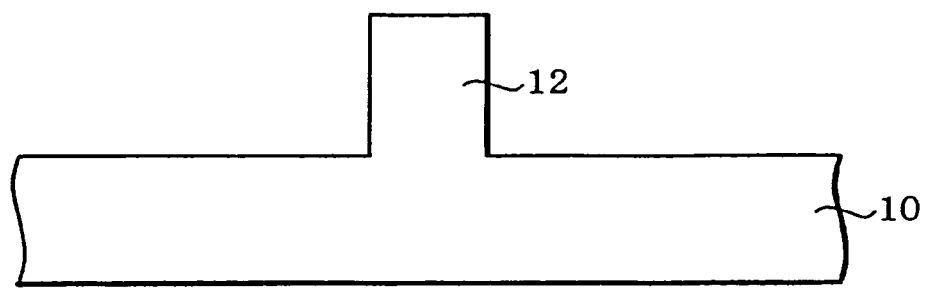
FIG. 3 is a schematic sectional view of a manufacturing process of the optical part shown in FIG. 1 and FIG. 2.

First, the convex part 12 is formed on the substrate 10 (refer to FIG. 3). The convex part 12 may be formed by subjecting the substrate to patterning or the convex part 12 may be formed by installing an opto-electrical element on the substrate 10. When patterning the substrate 10, there may be selected an appropriate method suitable for the material, shape, and size (for example, a selective growth method, a dry etching method, a wet etching method, a lift-off method and the like).

Figure 4:
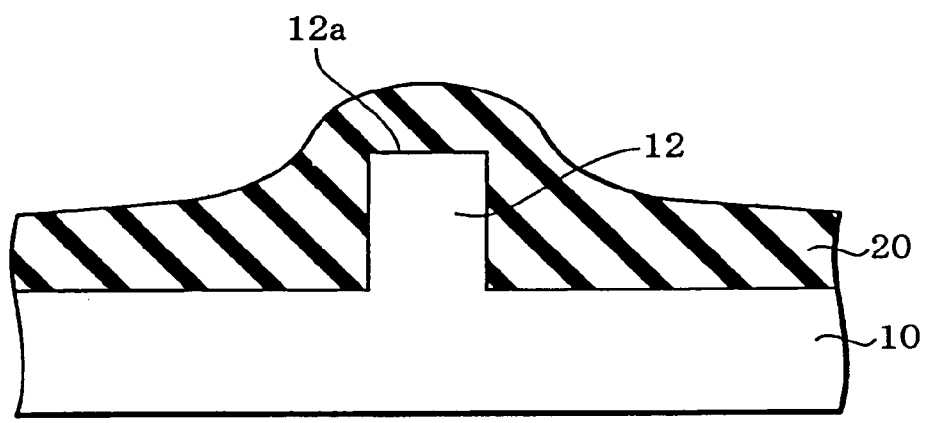
FIG. 4 is a sectional view schematically showing the manufacturing process of the optical part shown in FIG. 1 and FIG. 2.

Next, the covering layer 20 is layered over the substrate 10 (refer to FIG. 4). At this point, the covering layer 20 is layered over so that the upper surface (optical surface) 12a of the convex part 12 is covered with the covering layer 20. Also, it is desirable that the film thickness thereof is substantially equal to or less than a height of the convex part 12. For example, if the material of the covering layer 20 is a resin, for example, a method such as a spin coat method, a dipping method, an inkjet method may be employed to form the covering layer 20. In this case, by adjusting viscosity and a coating method of the resin, it is possible to control the shape of the resin to be layered over the optical surface 12a. Also, if the material of the covering layer 20 is composed of a silicon oxide layer, a silicon nitride layer, or a silicon oxide and nitride layer, for example, the chemical vapor deposition method may be used to overlay the covering layer 20.

Figure 5:
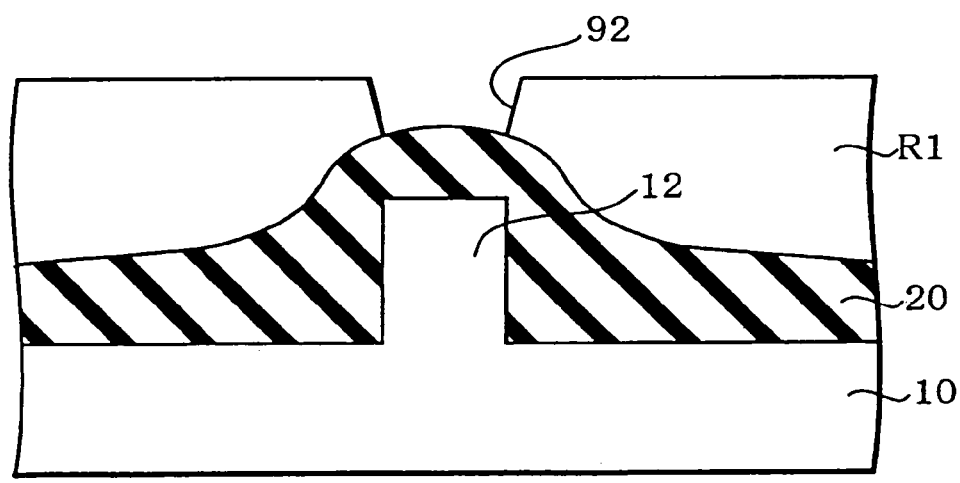
FIG. 5 is a sectional view schematically showing the manufacturing process of the optical part shown in FIG. 1 and FIG. 2.

Next, the spire part 24 is formed on the covering layer 20 (refer to FIG. 5 and FIG. 6).

The spire part 24 may be formed by the following method. First, according to the known process of photolithography, a photoresist layer R1 of a prescribed pattern is formed (refer to FIG. 5). As shown in FIG. 5, this photoresist layer R1 has an opening part 92 above the optical surface 12a. Subsequently, using this photoresist layer R1 as a mask, patterning is applied to the covering layer 20. By this means, the spire part 24 is formed on the covering layer 20 in a manner of surrounding the optical surface 12a. Also, an opening part 22 is formed on the optical surface 12a through formation of the spire part 24 (refer to FIG. 6). Next, this photoresist layer R1 is removed.

At this point, by controlling the shape and size of the opening part 92, it is possible to control the shape and size of the opening part 22. Further, depending on the height of the convex part 12, the thickness and shape of the covering layer 20 to be layered over the optical surface 12a, and conditions at the time of patterning, it is possible to control the shape and size of the spire part 24 and the opening part 22.

Figure 8:
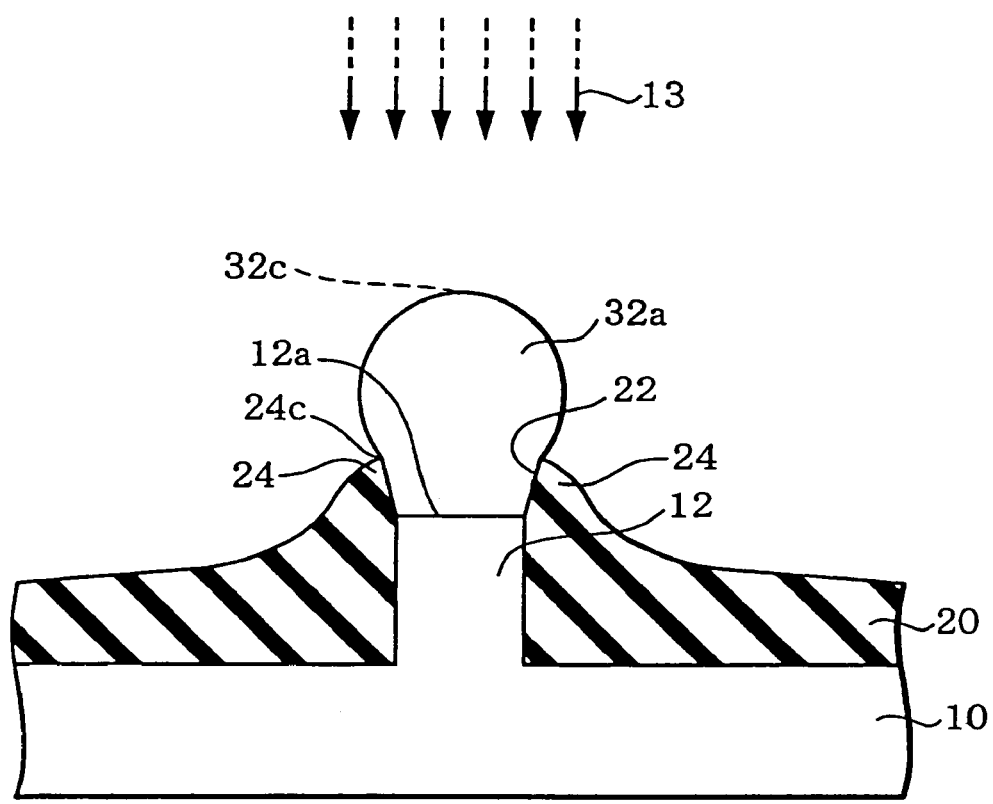
FIG. 8 is a sectional view schematically showing the manufacturing process of the optical part shown in FIG. 1 and FIG. 2.

Next, the optical member 32 is formed (refer to FIG. 7 and FIG. 8). Specifically, a liquid droplet 32b of a liquid material for forming the optical member 32 is ejected to the optical surface 12a to form a precursor 32a of the optical member. As mentioned above, the liquid material has a property of being hardenable with addition of energy 13.

As a method of ejecting the liquid droplet 32b, for example, a dispenser method or an inkjet method is cited. The dispenser method is a general method for ejecting a liquid droplet, and it is effective when ejecting the liquid droplet 32b over a relative wide area. Also, the inkjet method is a method of ejecting a liquid droplet by using the inkjet head, and it is possible to control a position of ejecting a liquid droplet of the order of picoliter. By this means, through ejecting the liquid droplet by using the inkjet method in this process, it is possible to manufacture the optical member 32 of a minute structure. In FIG. 7, there is shown a process of ejecting the liquid droplet from a nozzle 112 of an inkjet head 120 to the optical surface 12a.

The size of the precursor 32a of the optical member may be controlled by adjusting the ejection volume of the droplet 32b. Also, as shown in FIG. 8, the ejection volume of the liquid droplet 32b is adjusted so that the top part 32c of the precursor 32a of the optical member takes a higher position than the tip 24c of the spire part 24.

Now, by performing a lyophilic processing or a repellent liquefaction processing to the base and sidewall of the opening part 22 (optical surface 12a) as necessary, prior to ejecting the liquid droplet 32b, it is possible to control wettability to the liquid droplet 32b. By this means, it is possible to form the optical member 32 having the prescribed shape and size.

Next, the precursor 32a of the optical member is hardened and the optical member 32 is formed (refer to FIG. 8). Specifically, energy 13, such as heat or light, is applied to the precursor 32a of the optical member. When hardening the precursor 32a of the optical member, an appropriate method is used depending on the type of the liquid material. For example, addition of thermal energy or irradiation of light such as ultraviolet or a laser beam may be cited. By the above process, the optical part 100 including the optical member 32 is obtained (refer to FIG. 1 and FIG. 2).

The optical part and its manufacturing method according to this embodiment have the following operation/working-effect.

Figure 22:
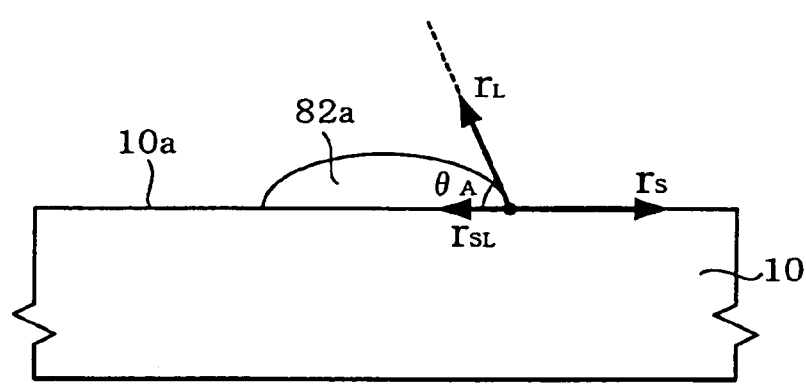
FIG. 22 is a sectional view schematically showing a manufacturing process of an optical part which is a comparison example.
Figure 23:
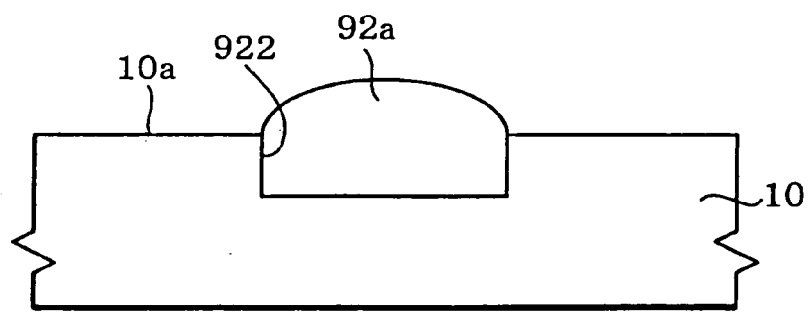
FIG. 23 is a sectional view schematically showing a manufacturing process of an optical part which is a comparison example.

First, it is possible to obtain the optical part 100 on which the optical member 32 having a desired shape and size is set up. Referring to drawings, the above-mentioned operation/working-effect will be described. First, before detailing the operation/working-effect according to this embodiment, manufacturing methods of other optical members will be described with reference to FIG. 22 and FIG. 23. FIG. 22 is a schematic sectional view of the manufacturing method of a general optical member, and FIG. 23 is a schematic sectional view of the manufacturing method of an optical member described in Japanese Patent Application No. 2002-55893.

As one method of manufacturing the optical member, there is known a method of obtaining the optical member by hardening, subsequent to forming a precursor of the optical member through ejecting a liquid material on the substrate 10, the precursor of the optical member. This method is used, for example, for manufacturing a micro-lens installed on a micro-lens substrate.

FIG. 22 is a sectional view of a state of a liquid material for forming the optical member being ejected on the substrate 10. Specifically, FIG. 22 shows a state prior to formation of the optical member, that is, a state in which a precursor 82a composed of a liquid material is set up on the substrate 10.

In FIG. 22, where $\gamma_S$ is a surface tension of the substrate 10, $\gamma_L$ is a surface tension of the liquid material (precursor of the optical member), $\gamma_{SL}$ is an interfacial tension between the substrate 10 and the liquid material, and $\theta_A$ is a contact angle of the liquid material relative to the substrate 10, the following equation (1) holds among $\gamma_S$, $\gamma_L$, and $\gamma_{SL}$.

$$\gamma_S = \gamma_L + \gamma_{SL} \cos \theta_A \qquad \text{equation (1)}$$

In FIG. 22, curvature of a precursor 82a of the optical member composed of a liquid material is subject to restriction due to the contact angle $\theta_A$ determined by equation (1). Namely, the curvature of the optical member obtained after hardening the precursor 82a of the optical member mainly depends on the material of the substrate 10 and the liquid material for determination. The curvature of the optical member is one element to determine the shape of the optical member. Consequently, according to the above-mentioned manufacturing method, it is difficult to control the shape of the optical member to be shaped.

Also, in this case, though not illustrated, there is known a method of enlarging the contact angle $\theta_A$ of the liquid material shown in FIG. 22 by ejecting a droplet of the liquid material after forming a film for adjusting a wet angle on a prescribed position of a surface 10a of the substrate 10. According to this method, the shape of the optical member may be controlled to some degree. However, there is a limit to controlling the shape of the optical member through formation of such film to adjust the wet angle.

Also, in Japanese Patent Application No.2002-55893, as one of the methods of manufacturing an optical member, there is described a method of hardening, after forming a precursor of the optical member by ejecting a liquid material to a concave part, this precursor of the optical member to obtain an optical member.

FIG. 23 is a schematic representation of the manufacturing method of the optical member described in Japanese Patent Application No. 2002-55893 as well as a sectional view of a state in which the liquid material for forming the optical member is ejected to the concave part 922. Specifically, FIG. 23 shows a state prior to hardening the precursor of the optical member, that is, a state in which the precursor 92a of the optical member composed of the liquid material is placed on the substrate 10.

According to this manufacturing method, by forming the optical member through hardening the precursor, after forming the precursor 92a of the optical member by ejecting a liquid material to the concave part 922, it is possible to control a position in which the optical member is formed. However, in this manufacturing method, in the same way as the method shown in (a) above, it is not easy to control the curvature and shape of the optical member to be formed.

On the other hand, in terms of the manufacturing method of the optical part according to this embodiment, as shown in FIG. 1, the spire part 23 is provided in a manner of surrounding the optical surface 12a. In the forming process of the optical member 32, when forming the precursor 32a of the optical member at least on the optical surface 12a, unless the first surface 24a of the spire part 24 is wet with the precursor 32a of the optical member, the surface tension of the first surface 24a does not act on the precursor 32a of the optical member, but the surface tension of the precursor 32a of the optical member mainly acts. As a result, by adjusting the ejection volume of the liquid droplet 32b for forming the precursor 32a of the optical member, it is possible to control the shape of the precursor 32a of the optical member, so that the optical member 32 having a desired shape and size may be obtained. The control of the ejection volume of the liquid droplet 32b is controlled by adjusting the ejection volume per one ejection or adjusting the number of times that ejects the liquid droplet.

Especially, it can be possible to form the optical member 32 with the maximum diameter $d_1$ of its horizontal section larger than the maximum diameter $d_2$ of a circle made up by the tip 24c of the spire part 24. This makes it possible to form an optical member 32 having a larger curvature.

Secondly, it is possible to control strictly the size and shape of the optical member 32. Namely, the shape of the optical member 32 may be made controllable by the ejection volume of the liquid droplet 32b. This makes it possible to obtain the optical part 100 including the optical member 32 having a desired shape and size.

Thirdly, the spire part 24 can be provided in a manner of surrounding the optical surface 12a. This makes it possible to dispose the optical member 32 stably on the optical surface 12a. Namely, since the optical member 32 is not only jointed to the base (optical surface 12a) of the opening part 22 but also jointed to the second surface 24b (sidewall of the opening part 22) of the spire part 24, it is difficult for the optical member 32 to come off the opening part 22. This makes it possible to obtain the optical part 100 having an excellent mechanical strength of a joint between the base and sidewall of the opening part 22.

Fourthly, position matching is made easy when forming the optical member 32 and the set-up position thereof may be strictly controlled. As mentioned above, the optical member 32 is formed by hardening the precursor 32a of the optical member, subsequent to forming the precursor 32a of the optical member through ejecting the liquid droplet 32b to the optical surface 12a (refer to FIG. 7 and FIG. 8). Generally, as shown in FIG. 22, it is difficult to control strictly a landing position of the liquid droplet by means of merely ejecting the liquid droplet on the substrate.

However, according to the manufacturing method of the optical part of this invention, by dropping the liquid droplet as targeted within an area surrounded by the spire part 24, the precursor 32a of the optical member is formed. Consequently, without making a special effort to match strictly one position to another, the optical member 32 may be formed. This makes it possible to obtain easily the optical member 32 whose set-up position is controlled.

Next, working examples to which the above-mentioned embodiment is applied will be described. According to an optical part of these working examples, the same operation/working-effect as the optical part 100 of the above-mentioned embodiment will be accomplished.

An optical part 110 of working example 1 is such that a convex part 130 (column-shaped part) is integrally formed of a semiconductor substrate 101 and part of a first mirror 102, while an optical part 150 of working example 2 is such that its convex part is composed of an opto-electrical element 90 set up on the substrate 10.

Figure 10:
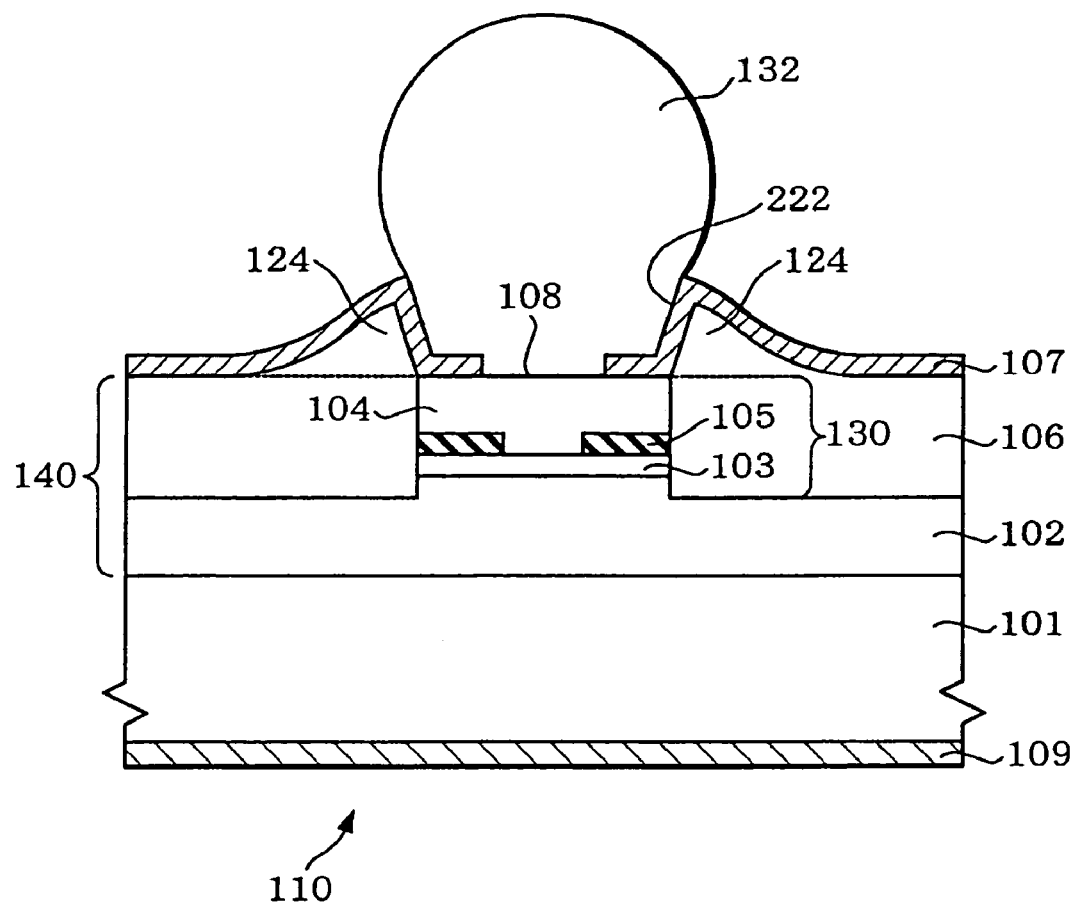
FIG. 10 is a sectional view of a variation example of the optical part according to a first embodiment.
Figure 11:
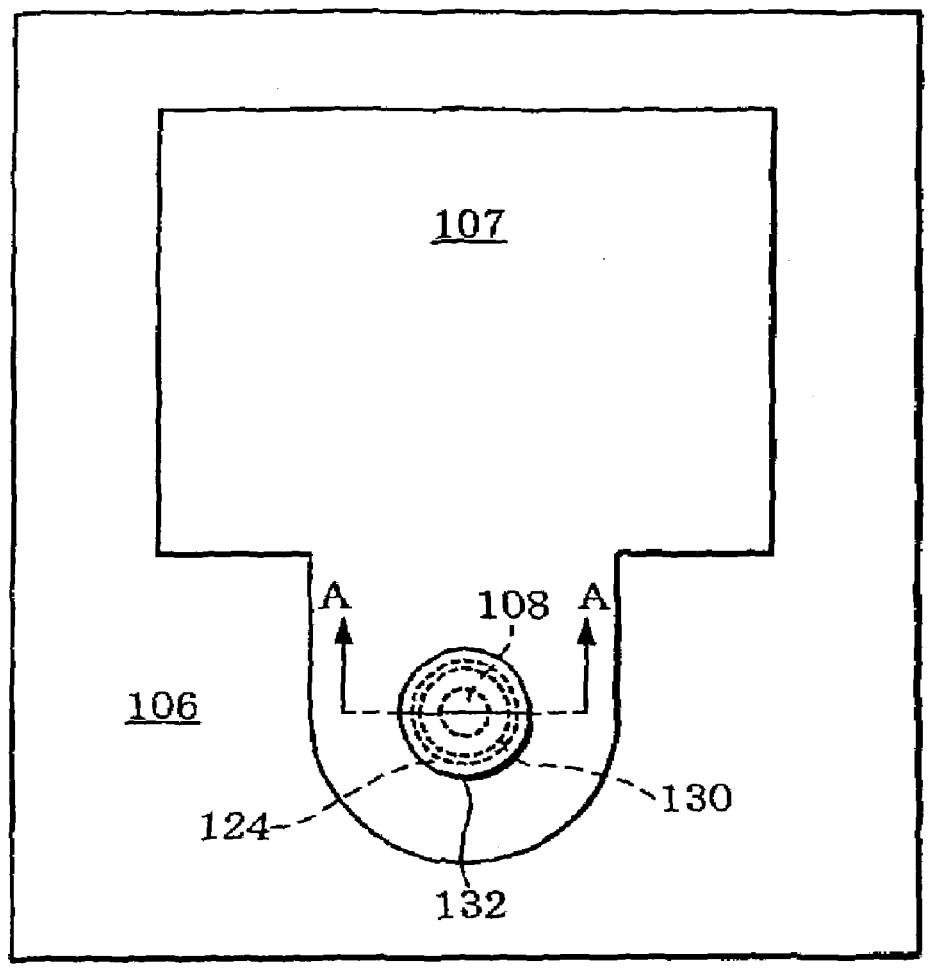
FIG. 11 is a plan view of the optical part shown in FIG. 10.

FIG. 10 is a schematic sectional view of the optical part 110 of the working example 1, whereas FIG. 11 is a plan view schematically showing the optical part shown in FIG. 10.

In this working example, there is shown a case where the optical part 110 is a light-emitting device of a surface light-emitting type (a surface light-emitting type semiconductor laser). In this optical part 110, the light-emitting device (a surface light-emitting type semiconductor laser) is provided below an optical surface 108, and a convex part 130 constitutes part of the light-emitting device.

This optical part 110 can include as FIG. 10 and FIG. 11 show, a semiconductor substrate 101 consisting of an n-type gallium arsenide and a vertical resonator (hereinafter referred to as the resonator) formed on the semiconductor substrate 101. This resonator 140 includes a column-shaped semiconductor deposit (hereinafter referred to as the column-shaped part) 130. This column-shaped part 130 is equivalent to the convex part as defined in the optical part 100 of this embodiment. Also, as shown in FIG. 10, in this working example, the resonator 140 including the semiconductor substrate 101 and the column-shaped part 130 is equivalent to the substrate in the optical part 100 of this embodiment.

From among the light-emitting devices such as a surface light-emitting type semiconductor laser as well as the light-receiving devices such as a photodiode, there is a device whose column-shaped part is set up on the substrate in the same way as the optical part 100 of this working example, with inclusion of an optical surface on an upper surface of the column-shaped part. In such device, it is possible to apply this invention by making use of the column-shaped part as a convex part which is so called in this invention.

Applying this invention to such device makes it possible to obtain an optical member having excellent controllability through a simple method.

This optical part 110 includes an optical surface 108 (light-emitting surface) as well as an optical member 132 set up on at least part of the optical surface 108. The optical member 132 is composed of the same material as the optical member 32 of this embodiment and may be formed by the same manufacturing method. The optical member 132 functions as a lens.

The optical surface 108 is set up on part of the upper surface of the column-shaped part 130. In the opto-electrical element 110 of this working example, a laser beam is emitted from this optical surface 108. Also, in this optical part 110, of the upper surface of the column-shaped part 130, a portion not covered by a first electrode 107 corresponds to the optical surface 108.

Further, a spire part 124 is set up on a covering layer (insulating layer) in a manner of surrounding the optical surface 108. Still further, by virtue of the spire part 124 being provided in the manner of surrounding the optical surface 108, an opening part 222 is formed on the optical surface 108.

Furthermore, the opening part 222 is provided on the convex part 130, and the optical surface 108 is positioned at part of a base of the opening part 222. Moreover, part of the optical member 132 is provided inside the opening part 222.

Next, each element constituting the resonator 140 will be described.

The convex part (column-shaped part) 130 is part of the resonator 140 and refers to a column-shaped semiconductor deposit at least including a second mirror 104. This convex part 130 is embedded in a covering layer 106. Namely, a side face of the convex part 130 is surrounded by the covering layer 106. Further, the first electrode 107 is formed thereon.

The resonator 140 includes, for example, 40 pairs of distributed reflection multi-film mirrors (hereinafter referred to as the first mirror) 102, in which an n-type $Al_{0.9}Ga_{0.1}As$ layer and an n-type $Al_{0.15}Ga_{0.85}As$ layer are alternately layered over, a Ga As well layer, and $Al_{0.3}Ga_{0.7}As$ barrier layer, and composed of sequential multi-layers of an active layer 103 including a quantum well structure which is made up of 3 layers of well layers, and 25 pairs of distributed reflection multi-film mirrors (hereinafter referred to as the second mirror) 104, in which an p-type $Al_{0.9}Ga_{0.1}As$ layer and an p-type $Al_{0.15}Ga_{0.85}As$ layer are alternately layered over. It is to be noted that composition of each layer making up the first mirror 102, the active layer 103, and the second mirror 104 as well as the number of layers are not limited by the foregoing.

The second mirror 104 is, for example, made into a p-type as C is subjected to doping, while the first mirror is made into a n-type as Si is subjected to doping. Consequently, a pin diode is formed of the second mirror 104, which is the active layer whose impurities are not subjected to doping, and the first mirror 102.

Also, a portion of the resonator 140 from a laser beam emission side of the optical part 110 midway to the first mirror 102 is subjected to etching in a circular shape as seen from the laser beam emission side, and the convex part 130 is formed. Now, in this embodiment, a planar shape of the convex part 130 is set as a circular shape, but any arbitrary shape may be used for this shape.

Further, in an area close to the active layer 103 of the layers constituting the second mirror 104, there is formed a current aperture 105 mainly consisting of aluminum oxide. This current aperture 105 is formed in a ring shape. Namely, this current aperture 105 has a section of a concentric shape when sliced on a plane parallel to the optical surface 108.

Also, in this optical part 110, the covering layer 106 is formed in a manner of covering the side face of the convex part 130 as well as an upper surface of the first mirror.

Further, the first electrode 107 can be formed on the convex part 130 and the covering layer 106. Still further, on the center of the upper surface of the convex part 130, there is provided a portion on which the first electrode 107 is not formed. This portion is the optical surface 108. This optical surface 108 becomes a laser beam emission surface. The first electrode 107 consists of, for example, a stacked layer of an Au and Zn alloy and Au.

Furthermore, on a reverse side of the semiconductor substrate, there is formed a second electrode 109. Namely, in the optical part 110 shown in FIG. 10 and FIG. 11, it is jointed with the first electrode 107 on the convex part 130 and jointed with the second electrode 109 on the reverse side of the semiconductor 101, current being injected to the active layer 103 by means of this first electrode 107 and the second electrode 109. The second electrode 109 consists of, for example, a stacked layer of an Au and Ge alloy and Au.

Materials for forming the first and the second electrode 107 and 109 are not limited to the above-mentioned matters. For example, metals, such as Ti and Pt and their alloys may be utilized.

In the manufacturing process of this optical part 110, the convex part 130 and the covering layer 106 are formed in the same method as the above-mentioned embodiment. Also, the spire part 124 is formed in the same method as the spire part 24 (refer to FIG. 1) of the above-mentioned embodiment. Next, there are respectively formed the first electrode 107 on the upper surface of the convex part 130 and on the upper surface of the covering layer 106, and the second electrode 109 on the reverse side of the semiconductor substrate 101 (in the semiconductor substrate 101, on a surface of the side opposite to a surface on which the resonator 140 is installed). When forming these electrodes, an annealing process is generally performed at about 400° C. (refer to the manufacturing process to be explained later). Consequently, when forming the covering layer 106 using a resin, to withstand this annealing process, it is necessary for a resin making up the covering layer 106 to be highly heat-resistant. To meet this requirement, it is desirable for the resin making up the covering layer 106 to be a polyimide resin, a fluorine type resin, an acrylic resin, an epoxy resin or the like. Especially, from a standpoint of ease of processing and an insulating property, the polyimide resin or the fluorine type resin is desirable. Also, when forming on the covering layer 106 the optical member 132 using a resin as its raw material, from the standpoint of a contact angle with the resin being large and ease of controlling a lens shape, it is desirable that the covering layer 106 consists of the polyimide resin or the fluorine type resin. In this case, the covering layer 106 is formed through hardening by energy irradiation such as heat or light or through hardening a precursor of the resin by chemical reaction.

Figure 12:
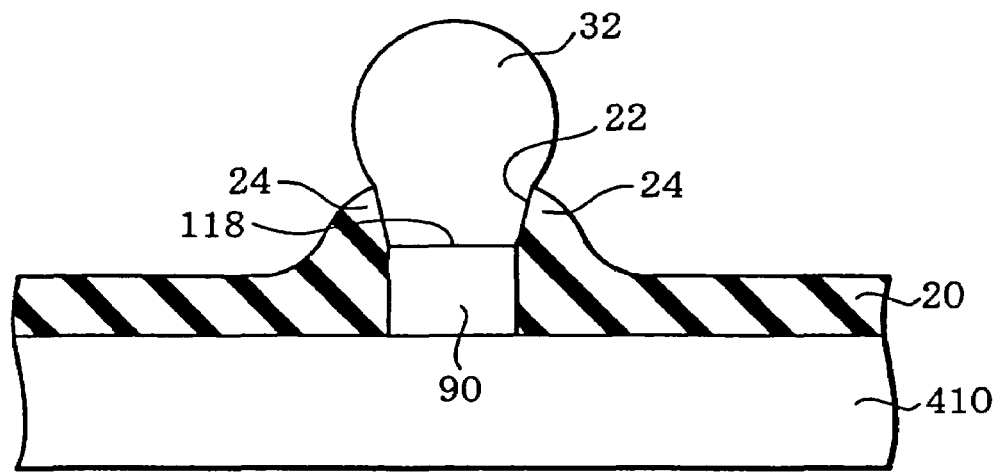
FIG. 12 is a sectional view schematically showing a variation example of the optical part according to a first embodiment.

FIG. 12 is a schematic sectional view of the optical part 150 of working example 2.

In the optical part 150 of this working example, an opto-electrical element 90 is mounted on a substrate 410. Namely, in this optical part 150, a convex part is made up from the opto-electrical element 90 and a substrate is made up from the substrate 410 and the opto-electrical element 90. This opto-electrical element 90 is a light-emitting device or a light-receiving device, and light emits from this optical surface 118 or light is incident thereto.

In this light part 150, the spire part 24 and the optical member 32 have the same configuration as the optical part 100 of the above-mentioned embodiment and may be formed by the same manufacturing method.

Figure 13:
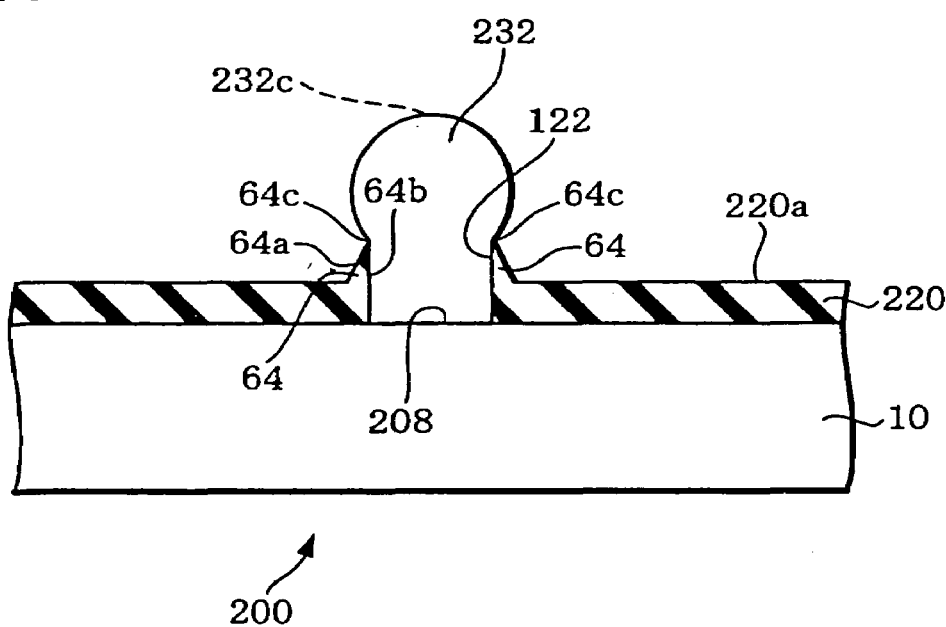
FIG. 13 is a sectional view schematically showing a variation example of the optical part according to a second embodiment.
Figure 14:
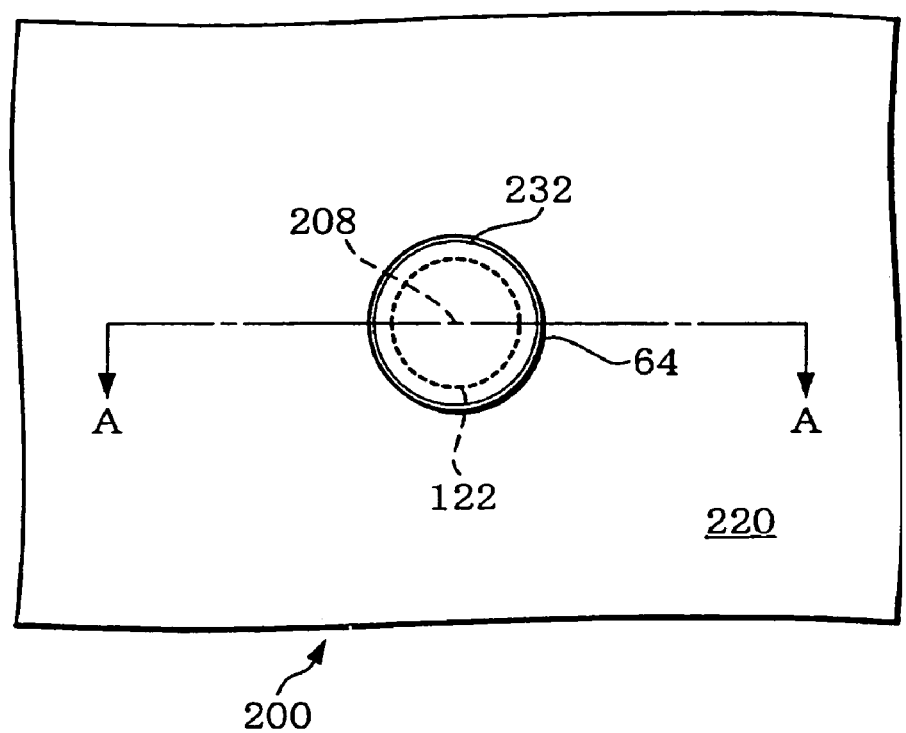
FIG. 14 is a plan view o schematically showing the optical part shown in FIG. 13.

FIG. 13 is a schematic sectional view of an optical part 200 to which this invention is applied according to an embodiment. FIG. 14 is a schematic plan view of the optical part 200 shown in FIG. 13. It is to be noted that FIG. 13 is a diagram showing a section along line A—A of FIG. 14.

The optical part 200 of this embodiment has a different configuration from the optical part 100 of the first embodiment (refer to FIG. 1 and FIG. 2) in that the convex part on which the optical part is set up is not formed on the substrate 10. Namely, in this optical part 200, an optical member 232 is provided on the substrate 10. Other composing elements have the same configuration as the optical part 100 of the first embodiment. Consequently, in the optical part 200 of this embodiment, with respect to the same composing elements as the optical part 100, the same reference numeral as each composing element of the first embodiment is provided and detailed explanation thereof is omitted.

The optical part 200 of this embodiment can include the substrate 10 having an optical surface 208, a spire part 64 provided in a manner of surrounding the optical surface 208, and the optical member 232 set up at least partly on the optical surface 208. A tip 64c of the spire part 64 is located at a higher position than the optical surface 208.

Also, in the optical part 200 of this embodiment, a covering layer 220 is set up on the substrate 10, and the spire part 64 is set up on the covering layer 220. In this manner, by setting up the spire part 64 in a manner of surrounding the optical surface 208, an opening part 122 is formed on the optical surface 208. Also, the optical surface is located at a base of the opening part 122. The covering layer 220 and the optical member 232 may be composed of the same material as the covering layer 20 and the optical member 32 of the first embodiment.

Also, the spire part 64 has a first surface 64a and a second surface 64b. An intersection between the first surface 64a and the second surface 64b is the tip 64c of the spire part 64. The first surface 64a constitutes part of an upper surface 220a of the covering layer 220, and further, the second surface 64b constitutes part of a sidewall of the opening part 122.

The optical surface 208 may well be provided on at least part of the base of the opening part 122. Also, the spire part 64 may well be in the shape illustrated of the first embodiment and its variation examples.

Part of the optical member 232 is provided on the opening part 122. A top part 232c of the optical member 232 is formed up to a higher position than the tip 64c of the spire part 64.

Next, the manufacturing method of the optical part 200 shown in FIG. 13 and FIG. 14 will be described with reference to FIG. 15(a) to FIG. 15(d). FIG. 15(a) to FIG. 15(d) are respectively schematic sectional views of a general manufacturing process of the optical part 200 shown in FIG. 13 and FIG. 14.

First, the covering layer 220 is set up on the substrate 10 (refer to FIG. 15 (a)). At this point, since a film thickness of the covering layer 220 is one element determining the height of the spire part 64, it is desirable to determine the film thickness of the covering layer 220 by taking into consideration the height of the spire part 64 to be finally obtained. Next, according to the known process of photolithography, a photoresist layer R2 of a prescribed pattern is formed on the covering layer 220.

Figure 15A:
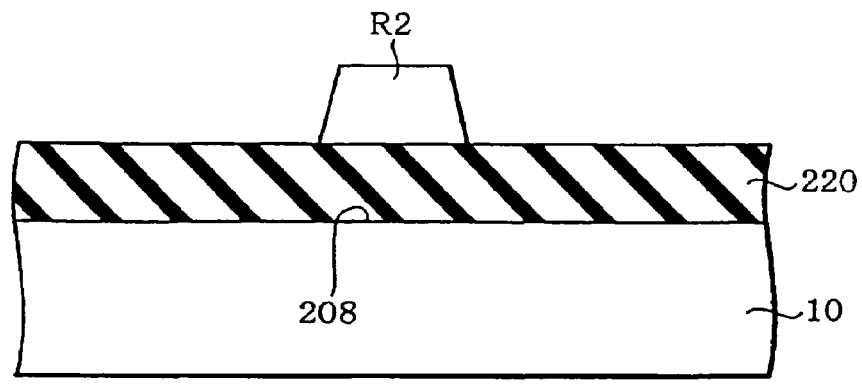
FIG. 15(a)–FIG. 15(d) are respective sectional views schematically showing a manufacturing process of the optical part shown in FIG. 13 and FIG. 14.
Figure 15B:
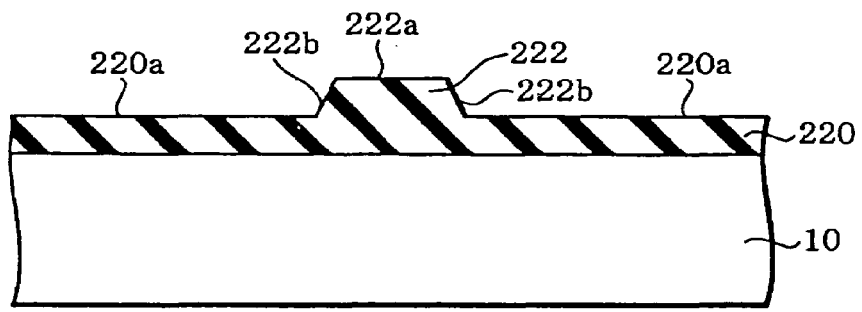

Next, by patterning the covering layer 220 with this photoresist layer R2 as a mask, the convex part 222 is formed (refer to FIG. 15(b)). At this point, by completing patterning when the covering layer 220 is halfway removed, it is possible to form the convex part 222. This convex part 222 is set up at least above the optical surface 208.

At this point, by adjusting conditions, such as a baking condition and an exposure condition, of the photoresist layer R2, a sidewall 222b of this convex part 222 is formed into a progressive taper shape (refer to FIG. 15(b)). Namely, a section of the convex part 222 in a surface parallel to the optical surface 208 is arranged such that it grows as it becomes nearer to the substrate 10. In this manner, by making the sidewall 222b of this convex part 222 in the progressive taper shape, it is possible to make an angle $\theta_4$ an acute angle as formed between the first surface 64a and the second surface 64b of the spire part 64 which is formed in a later process to be explained. Next, this photoresist layer R2 is removed.

Figure 15C:
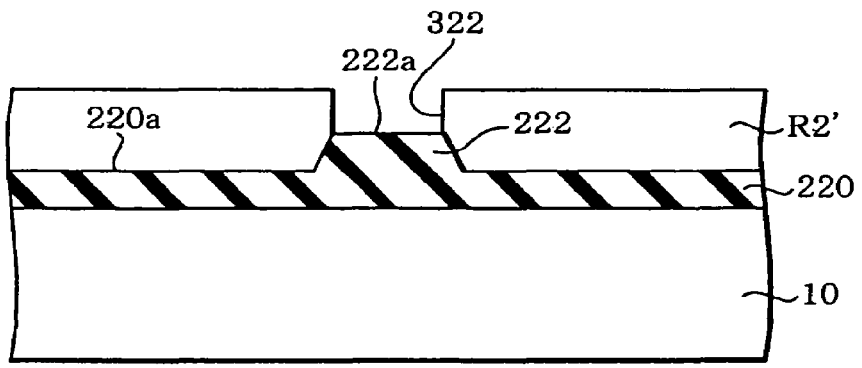
Figure 15D:
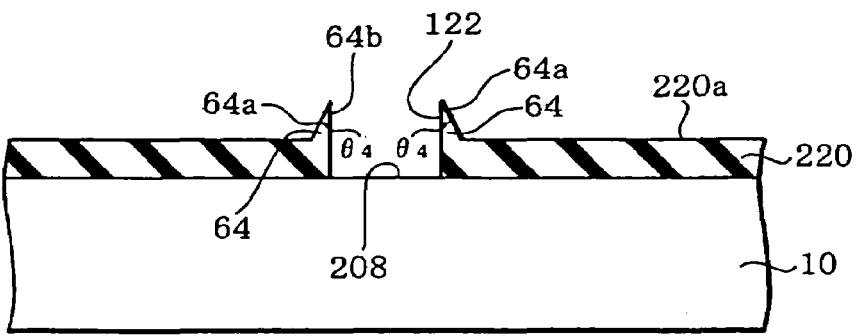

Subsequently, by means of the publicly known process of photolithography, a photoresist layer R2' of a prescribed pattern is formed on the covering layer 220 (refer to FIG. 15(c)). This photoresist layer R2' has an opening part 322 on an upper surface 222a of the convex part 222.

This is followed by forming the opening part 122 by patterning the convex part 222 with this photoresist layer R2' as a mask. At this point, the opening part 122 is formed so that the spire part 64 is formed (refer to FIG. 15(d)). Next, this photoresist layer R2' is removed.

The spire part 64 includes the first surface 64a and the second surface 64b. An angle $\theta_4$ as formed between the first surface 64a and the second surface is an acute angle. Also, the opening part 122 is formed such that the optical surface 208 is included in at least part of its base.

Next, the optical member 132 is formed. The optical member 132 may be manufactured in the same method as the optical member 32 of the first embodiment.

By the above-mentioned process, the optical part 200 including the optical member 132 is obtained (refer to FIG. 13 and FIG. 14).

Now, in the manufacturing method of the optical part of this embodiment, there has been shown a case where the covering layer 220 is formed by the process of photolithography. However, if a material of the covering layer 220 is, for example, a resin, a method such as stamping may be used to form a covering layer of a prescribed pattern.

According to the optical part of this embodiment, the same operation/working-effect as the optical part of the first embodiment is produced.

Next, working examples to which the above-mentioned embodiment is applied will be described. According to the optical part of this working example, the same operation/working-effect as the optical part of the first embodiment may be achieved.

An optical part 201 of working example 3 is an application of this embodiment to a micro-lens substrate, whereas an optical part 202 of working example 4 is an application of this embodiment to an opto-electrical element.

Figure 16:
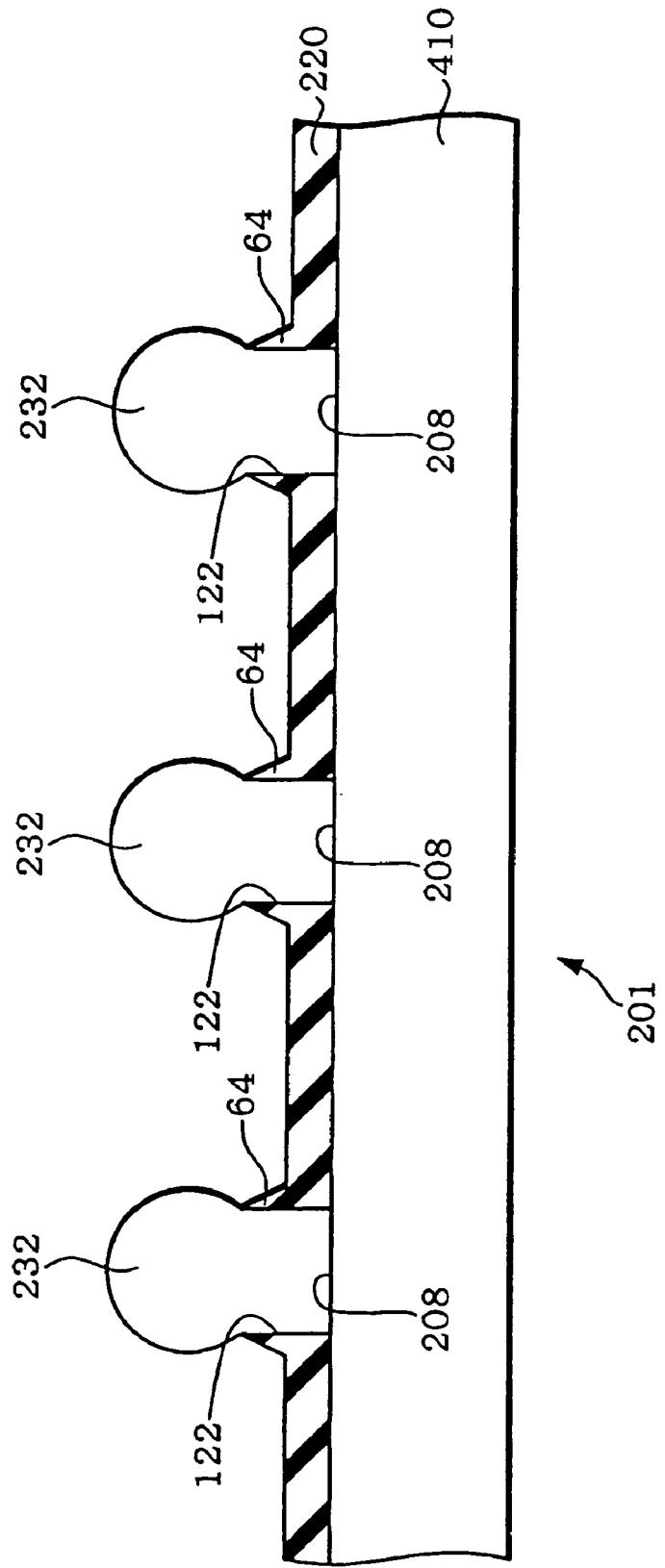
FIG. 16 is a sectional view schematically showing a variation example of the optical part according to a second embodiment.

FIG. 16 is a schematic sectional view of the optical part 201 of working example 3. In this working example, there is shown a case where the optical part 201 is a micro-lens substrate.

As shown in FIG. 16, a plurality of optical members 232 are set up on the optical part 201. The optical members 232 constituting the optical part 201 of this working example has the same configuration as the optical member 232 constituting the optical part 200 of this embodiment.

The optical part 201 (micro-lens substrate) of this working example is set up, for example, on a pixel section of a liquid crystal display panel, a light-receiving surface of a solid state image sensor (CCD), and an optical coupling unit of an optical fiber. This is the same as when applying other embodiments to a micro-lens substrate.

Figure 17:
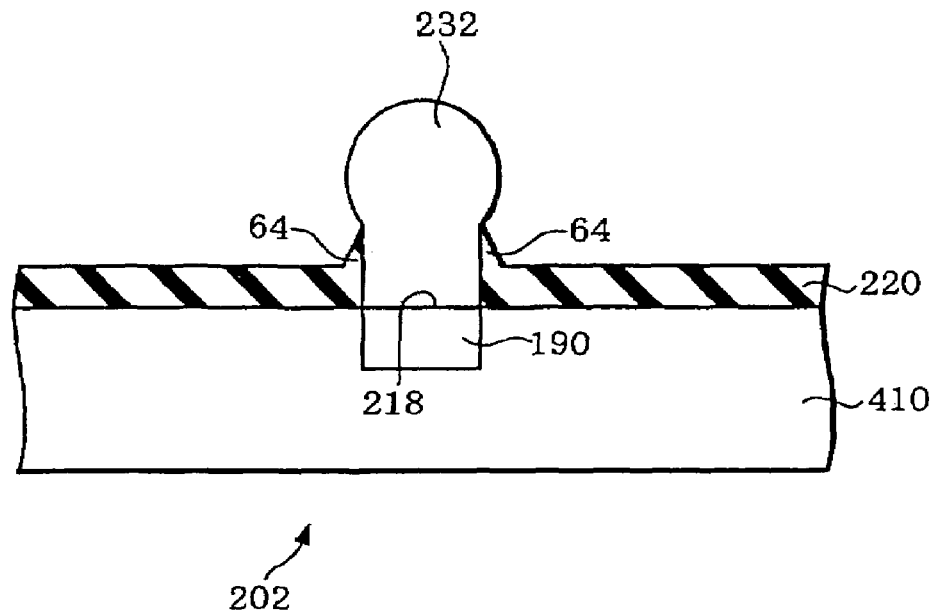
FIG. 17 is a sectional view of a variation example of the optical part according to a second embodiment.

FIG. 17 is a schematic sectional view of the optical part 202 of working example 4. This optical part 202 can include a substrate 410 having an optical surface 218 and an optical member 232 set up on the optical surface 218. In this optical part 202, an opto-electrical element 190 is provided below the optical surface 218. Specifically, the opto-electrical element 190 is embedded in the substrate 410. This opto-electrical element 190 may be a light-emitting device or a light-receiving device.

Figure 18:
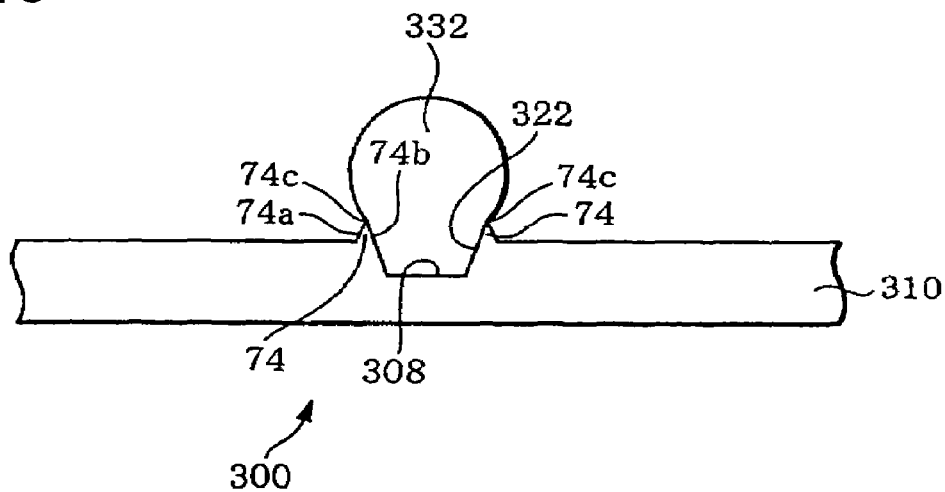
FIG. 18 is a sectional view schematically showing an optical part according to a third embodiment.
Figure 19:
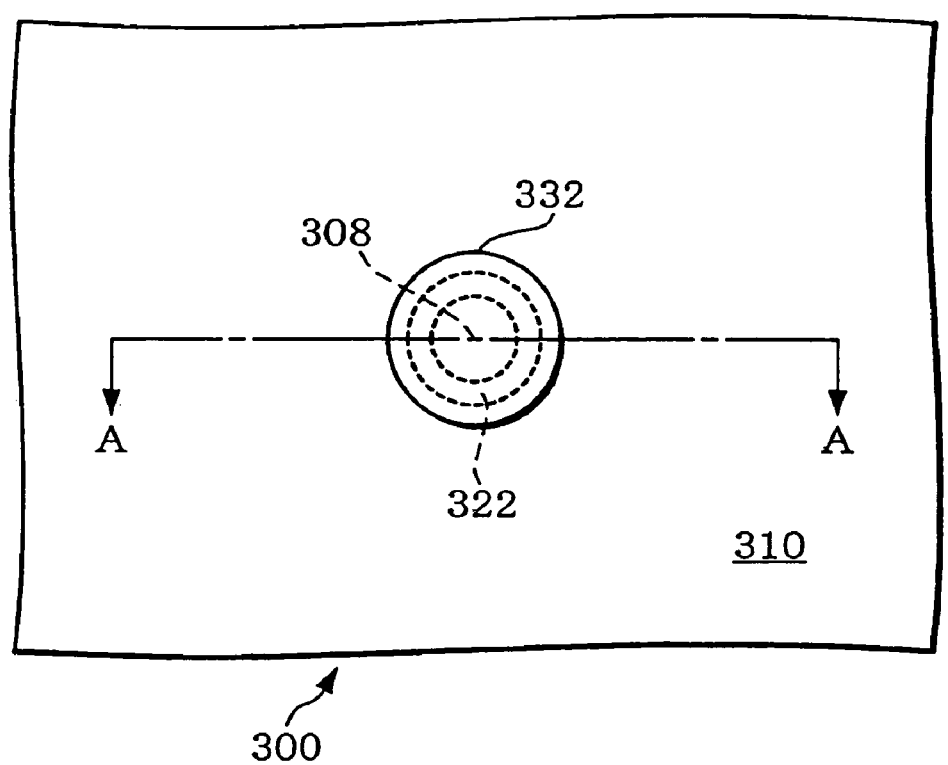
FIG. 19 is a plan view of the optical part shown in FIG. 18.
Figure 20A:
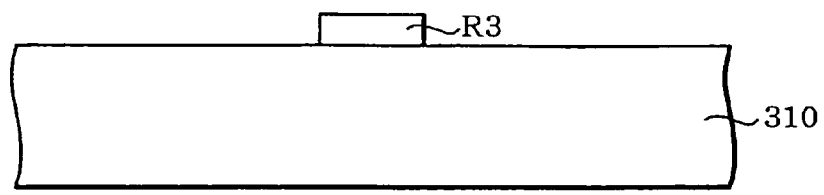
FIG. 20(a)–FIG. 20(f) are respective sectional views schematically showing a manufacturing process of the optical part shown in FIG. 18 and FIG. 19.
Figure 20B:
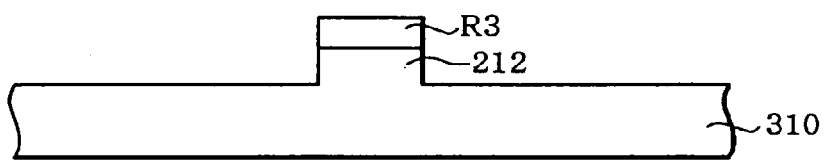
Figure 20C:
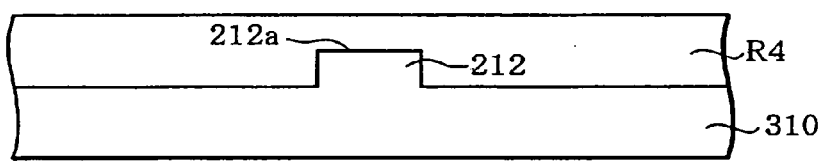
Figure 20D:
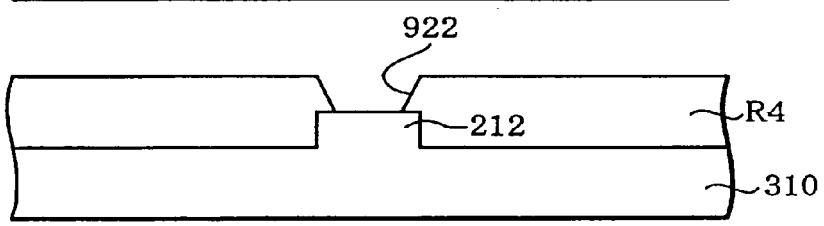
Figure 20E:
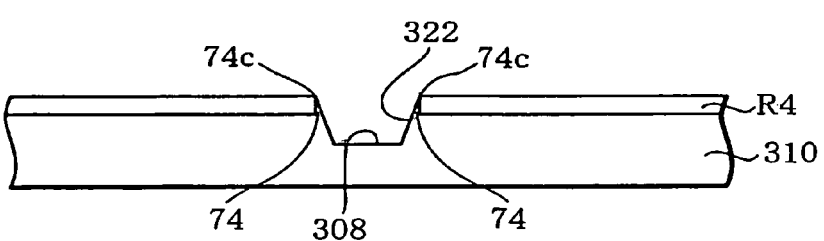
Figure 20F:
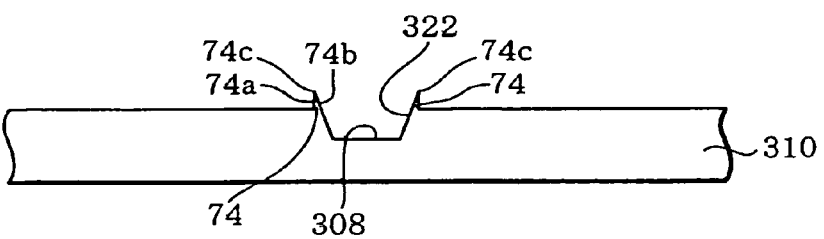

FIG. 18 is a schematic sectional view of an optical part 300 to which this invention is applied according to one embodiment. FIG. 19 is a schematic plan view of the optical part 300 shown in FIG. 18. It is to be noted that FIG. 18 is a diagram showing a section along line A—A of FIG. 19.

The optical part 300 of this embodiment has a different configuration from the optical part 100 of the first embodiment (refer to FIG. 1 and FIG. 2) in that a convex part and a covering layer are not provided and that a spire part 74 is formed on a substrate 310. Other composing elements are the same as the optical part 100 of the first embodiment. Consequently, in the optical part 300 of this embodiment, with respect to the same composing elements as the optical part 100, the same reference numeral as each composing element of the first embodiment is provided and detailed explanation thereof is omitted.

The optical part 300 of this embodiment can include the substrate 310 having an optical surface 308, the spire part 74 set up in a manner of surrounding the optical surface 308, and an optical member 332 set up on least part of the optical surface 208. A tip 74c of the spire part 74 is located at a higher position than the optical surface 308.

Also, in the optical part 300 of this embodiment, the spire part 74 has a first surface 74a and a second surface 74b. An intersection between the first surface 74a and the second surface 74b is the tip 74c of the spire part 74. The second surface 74b constitutes part of a sidewall of a concave part 322. Further, the optical surface 308 is provided at a base of the concave part 322. Now, in this optical part 300, the optical surface 308 may be provided on part of the base thereof.

Shapes shown in the first embodiment and its variations may be applied to a shape of the spire part 74. Also, the optical member 332 is formed of the same material as the optical member 32 of the first embodiment. Further, what is shown as the material of the substrate 10 in the first embodiment may be used for the material of the substrate 310.

Next, the manufacturing method of the optical part 300 shown in FIG. 18 and FIG. 19 will be described with reference to FIG. 20(*a*) to FIG. 20(*f*). FIG. 20(*a*) to FIG. 20(*f*) are respectively schematic sectional views of a general manufacturing process of the optical part 300 shown in FIG. 18 and FIG. 19.

First, according to the known process of photo-lithography, a prescribed photoresist layer R3 is layered over the substrate 310 (refer to FIG. 20(*a*)). At this point, the photoresist layer R3 is formed in an area where at least the spire part 74 and the opening part 322 are set up.

Next, by patterning the substrate 10 with this photoresist layer R3 as a mask, the concave part 212 is formed (refer to FIG. 20(*b*)). A proper patterning method is selected, depending on the material of the substrate 310. For example, in a case where the substrate 310 is a glass substrate, there may be cited wet etching by hydrogen fluoride, etching by ion beam, fine processing by laser, a sandblasting method and the like. Of these, the sandblasting method is effective when patterning a relatively broad area. The sandblasting method is a manufacturing method of etching through blasting particulates, whose particle diameters range from 1 μm to 20 to 30 μm, to a workpiece, and a resolution of approximately 20 μm may be obtained. For particulates used for the sandblasting method, SiC, $AlO_2$ and the like may be cited. Thereafter, the photoresist layer R3 is removed.

Next, a photoresist layer R4 is layered over the substrate 310 (refer to FIG. 20(*c*)). At this point, even if the photoresist layer R4 is small, at least an upper surface 212a of a concave part 212 should be covered.

Next, an opening part 922 is formed on the upper surface 212a of the concave part 212 (refer to FIG. 20(*d*)). At this point, by adjusting conditions, such as a baking condition and an exposure condition, of the photoresist layer R4, the opening part 922 is formed into a progressive taper shape, namely, a diameter of the opening part 922 is arranged such that it grows as it becomes nearer to the top of the opening part 922.

Subsequently, while retreating the photoresist layer R4, the photoresist layer R4 and the substrate 310 are subjected to isotropic etching (refer to FIG. 20(*e*)). This permits the convex part 212 to be etched, and the concave part 322 is formed in the substrate 310, while a spire part 74 is formed in a manner of surrounding an optical surface 308. At this point, a shape and size of the concave part 322 is one element for determining a shape and size of a section of the optical member 332.

Next, this photoresist layer R4 is removed (refer to FIG. 20(*f*)).

Subsequently, the optical member 332 is formed (refer to FIG. 18). It is possible to manufacture the optical member 332 by using the same method as the optical member 32 of the first embodiment.

By means of the above-mentioned process, the optical part 300 including the optical member 332 may be obtained (refer to FIG. 18 and FIG. 19)).

According to the optical part of this embodiment, the same operation/working-effect as the optical part of the first embodiment is produced.

Next, a variation example to which this embodiment mentioned above is applied will be described. According to the optical part 301 of this variation example, the same operation/working-effect as the optical part 300 of this embodiment mentioned above may be achieved.

Figure 21:
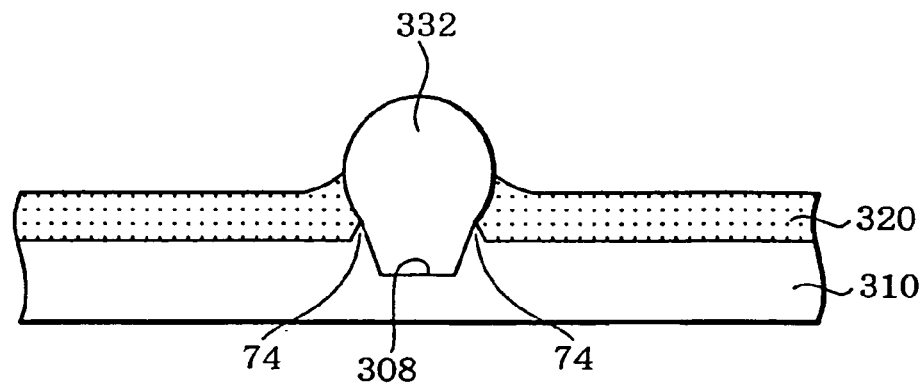
FIG. 21 is a sectional view schematically showing a variation example of the optical part according to a third embodiment.

The optical part 301 of this variation example is, as shown in FIG. 21, obtained by embedding a sealant 320 around the optical part 300 of this embodiment. It is desirable that the sealant 320 is composed of a material having less refractive index than a material making up the optical member 332. There is no particular restriction regarding the material of the sealant 320, but, for example, a resin may be used. Now, the same applies to the optical members of other embodiments mentioned above; as necessary, a sealant may be embedded around the optical member.

It should be understood that invention is not limited to the above-mentioned embodiments, and a host of variations are possible. For example, this invention can include virtually the same configuration as the configuration described in regard to the embodiments (for example, the identical configuration with respect to function, method and result, or the identical configuration with respect to object and result). Also, this invention can include a configuration which replaced any nonessential portion of the configuration described with respect to the embodiments. Further, this invention can include a configuration providing the identical operation/working-effect to a configuration described with respect to the embodiments or a configuration capable of accomplishing the identical object. Furthermore, this invention can incorporate a configuration which is the configuration described in the embodiments with addition of known techniques.

What is claimed is:

1. An optical part, comprising:
    a substrate having an optical surface;
    a spire part that is disposed so as to surround the optical surface, the spire part having a first surface that faces the optical surface and a second surface that faces away from the optical surface, the first and second surfaces being inclined surfaces with respect to a surface of the substrate;

an optical member disposed on at least part of the optical surface; and a tip of the spire part being located at a higher position than the optical surface, the first surface intersecting the second surface at the tip of the spire part.

2. The optical part according to claim 1, the spire part being set up on the substrate.

3. The optical part according to claim 1, a covering layer being provided above the substrate and the spire part being set up on a covering layer.

4. The optical part according to claim 1, a top part of the optical member being located at a higher position than the tip of the spire part.

5. The optical part according to claim 1, a portion functioning as an opto-electrical element being provided below the optical surface.

6. The optical part according to claim 1, the optical member functioning as a lens.

7. The optical part according to claim 6,
a circle or an ellipse being made up by the tip of the spire part;
a section of the optical member being a circle or an ellipse; and
a center of the optical surface coinciding with a center of the circle or the ellipse made up by the tip of the spire part.

8. The optical part according to claim 1,
a circle or an ellipse being made up by the tip of the spire part;
a section of the optical member being a circle or an ellipse; and
a maximum diameter of the section of the optical member being larger than the circle or the ellipse formed by the tip of the spire part.

9. The optical part according to claim 1,
a convex part being provided on the substrate, and
the optical surface being placed on at least part of an upper surface of the convex part.

10. The optical part according to claim 9,
the convex part constituting at least part of the opto-electrical element.

11. The optical part according to claim 1, a perimeter of the optical member being surrounded by a sealant.

12. An optical part, comprising:
a substrate having an optical surface;
a spire part that is disposed so as to surround the optical surface; and
an optical member disposed on at least part of the optical surface;
a tip of the spire part being located at a higher position than the optical surface,
the optical surface being higher than a surface of the substrate.

13. An optical part, comprising:
a substrate having an optical surface;
a spire part that is disposed so as to surround the optical surface; and
an optical member disposed on at least part of the optical surface;
a tip of the spire part being located at a higher position than the optical surface,
a circle or an ellipse being made up by the tip of the spire part;
a section of the optical member being a circle or an ellipse; and
a maximum diameter of the section of the optical member being larger than the circle or the ellipse formed by the tip of the spire part.

* * * * *